(12) United States Patent
Ryan et al.

(10) Patent No.: US 6,284,072 B1
(45) Date of Patent: Sep. 4, 2001

(54) MULTIFUNCTIONAL MICROSTRUCTURES AND PREPARATION THEREOF

(75) Inventors: Timothy George Ryan; Thomas Grierson Harvey, both of Middlesborough (GB)

(73) Assignee: Epigem Limited, Middlesborough (GB)

( * ) Notice: Subject to any disclaimer, the term of this patent is extended or adjusted under 35 U.S.C. 154(b) by 0 days.

(21) Appl. No.: 09/297,484

(22) PCT Filed: Nov. 10, 1997

(86) PCT No.: PCT/GB97/03008

§ 371 Date: Aug. 6, 1999

§ 102(e) Date: Aug. 6, 1999

(87) PCT Pub. No.: WO98/21626

PCT Pub. Date: May 22, 1998

(30) Foreign Application Priority Data

Nov. 9, 1996 (GB) .................................................. 9623185

(51) Int. Cl.$^7$ .................................................... H01L 21/50
(52) U.S. Cl. ............................ 156/59; 156/209; 156/220; 156/306.9; 427/264; 204/192.1
(58) Field of Search ................................ 428/209; 204/11; 156/659.1, 658, 660, 59, 220, 209, 306.9; 427/264

(56) References Cited

U.S. PATENT DOCUMENTS

| 4,646,634 | 3/1987 | Espe | 101/32 |
| 4,661,212 | 4/1987 | Ehrfeld et al. | 204/11 |
| 5,259,926 | 11/1993 | Kuwabara et al. | 156/659.1 |

FOREIGN PATENT DOCUMENTS

| 3926918A1 | 8/1989 | (DE) . |
| 4001399C1 | 1/1990 | (DE) . |
| 63-0064533 | 3/1988 | (JP) . |
| 1-0199993 | 7/1989 | (JP) . |
| WO 95/09726 | 4/1995 | (WO) . |

OTHER PUBLICATIONS

Tazuke, Shigeo, An Introduction to Specialty Polymers, *Polymers Having Energy–Converting Capability*, pp. 108–111, no date.

Bladon, John, *The Tin–Palladium Catalyst: A Review*, pp. 1–8.

Wang, Y.H., et al., Plating and Surface Finishing, *The Kinetics of $PdCl_2/SnCl_2$ Activating Solutions for Electroless Plating*, 1982, p. 59, no month.

*Primary Examiner*—Cathy Lam
(74) *Attorney, Agent, or Firm*—Van Tassel & Associates

(57) ABSTRACT

A composite multifunctional microstructure which comprises at least one functionalizing material associated with a microstructure wherein the microstructure comprises a layer of relief forming material preferably comprising an at least partially UV curable relief forming polymer having a plurality of relief features formed therein to provide at least one retaining feature and wherein the functionalizing material is deposited within and substantially or partially fills or lines the at least one retaining feature, method for the preparation thereof.

20 Claims, 7 Drawing Sheets

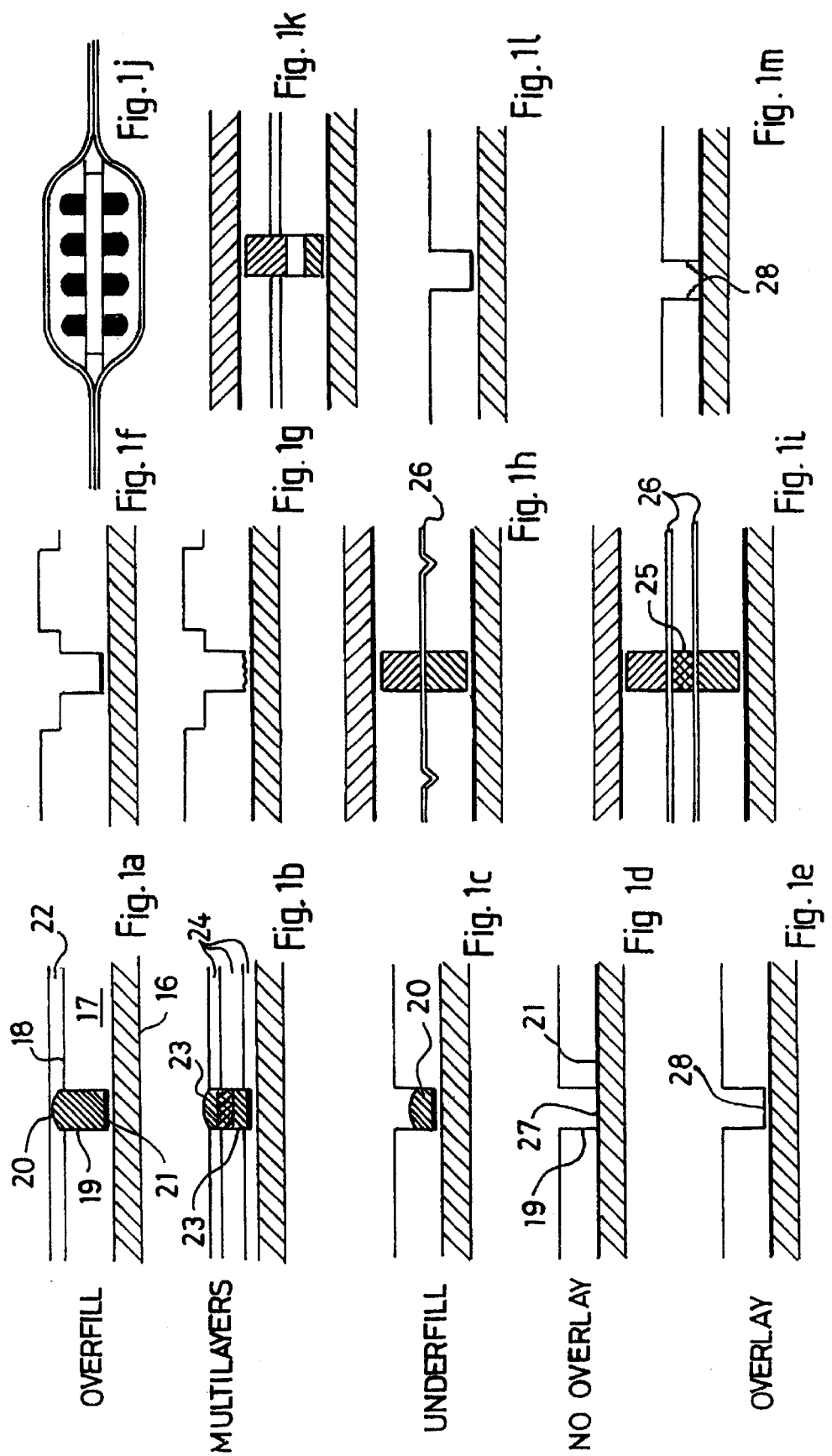

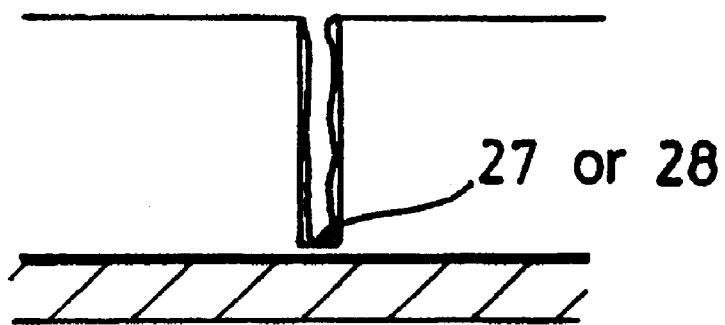
Fig. 1n
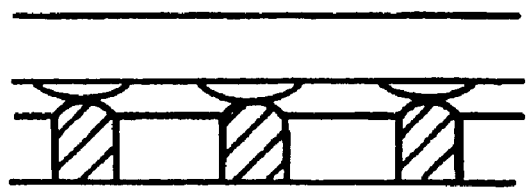
Fig. 1p
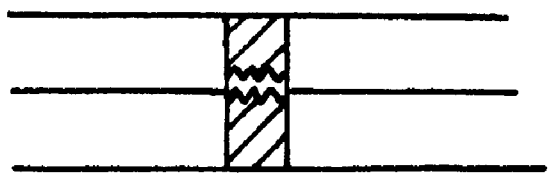
Fig. 1q
Fig. 1r

MULTIFUNCTIONAL MICROSTRUCTURES AND PREPARATION THEREOF

The present invention relates to multifunctional microstructures comprising fine line microcircuits and/or micro arrays of functionalising material, a method for production and the use thereof in microsystems, to apparatus for the production thereof, and to microsystems comprising the microstructures of the invention. In particular the invention relates to multifunctional microstructures comprising fine line circuitry and/or arrays of electrically active material associated with micro relief elements or arrays of elements for micro-optic, micro-fluidic, micro-electrical, micro-acoustic, micro-magnetic, micro-biological and/or micro-mechanical applications, to a method for production and use thereof in multifunctional microsystems, apparatus for the production thereof, and to multifunctional microsystems comprising the fine line structures.

For the development of new microsystems products there are requirements not only for microelectronics in chip form but also for a range of micromachined components that link, or are linked to, chip processors, for example display modules, sensors, actuators, power sources or information receiving/transmitting antennae.

In order to offer full microsystem solutions, microelectronic components need to be integrated with micromachined components. The microelectronic components allows the intelligence to be put into the system often through the use of silicon chips (ASICs). With miniaturisation of chips and the demand for increasing numbers of functions per unit area, there is a requirement for finer micromachined components, in particular interconnect structures, of increasing complexity, without loss of quality or robustness, that may be incorporated in flexible or rigid printed circuit boards for example.

A trend towards miniaturisation in manufacturing is well established, particularly in the microelectronics and computing fields. The requirements for small size and high precision are becoming increasingly important in other areas such as computer displays, healthcare products, fibre optics, communications and sensors of all kinds.

Whilst in some applications it is possible to integrate all microsystem functionality on a single chip, hybrid microsystems often outperform single substrate technology and can provide great flexibility. In hybrid microsystems the technology that is best suited to each component is employed and advanced interconnection techniques are used to link all the components or sub-systems together. This invention provides advanced interconnection products and techniques.

Single substrate fabrication depends on lithographic processes developed by the semi-conductor industry and involves the use of masks to allow exposure of patterns into photo-sensitive materials that allow selective etching to provide surface reliefs. More complex three dimensional or multi layer structures can be created by repeated use of deposition, exposure and etching processes.

Currently reel to reel techniques for production of flexible printed circuit boards employ lithography to introduce circuitry into copper filled laminates. Alternatively printing methods have been developed using lower conductivity materials such as conducting inks for applications where high resolution is not a requirement. Existing reel to reel printing and lithographic processes do not provide the requisite small size and precision demanded by industry trends and are limited in functionality.

There is therefore a need to provide high resolution miniaturised microstructures which are capable of supporting additional materials in multifunctional manner, and a convenient low cost, preferably reel to reel method for the production thereof, in particular in a variety of substrates and complexity of designs.

We have now surprisingly found that multifunctional microstructures may be provided which are capable of meeting the aforementioned objects in admirable manner and which may be produced by a convenient method which is associated with additional advantages and accesses a new range of uses and applications.

Accordingly in its broadest aspect there is provided according to the present invention a multifunctional microstructure which comprises at least one functionalising material associated with a microstructure wherein the microstructure comprises a layer of relief forming material preferably comprising an at least partially UV curable relief forming polymer having a plurality of relief features formed therein to provide at least one retaining feature; and wherein the functionalising material is deposited within and substantially or partially fills or lines the at least one retaining feature.

Preferably the system comprises:
  a) An optional/dispensable first layer of a first substrate, the optional/dispensable first layer having a receptive surface capable of retaining a relief forming polymer,
  b) an optionally dispensable second layer of a relief forming polymer that is preferably at least partially UV curable, over the receptive surface;
  c) a plurality of optionally dispensable relief features formed in the second layer of relief forming material to provide at least one retaining structure; and
  d) a third layer of at least one functionalising material deposited within and substantially or partially filling or lining the at least one retaining feature.

It is a particular advantage that the functionalising material may be deposited within the at least one retaining feature with thickness, deposit width or spacing between adjacent deposits of the order of micro level to molecular level, and may advantageously be used for microorders of 25 micron and less. The microstructure of the invention provides as a particularly novel feature the ability to achieve such deposits of the order of 15 micron and less, more preferably 10 micron and less. It is envisaged that the material may be deposited in dimensions down to even orders of 1 or 0.1 micron.

The functionalising material may comprise:
  any substantially non UV curable non polymeric material such as a targeted growth material which may be obtained by deposition of a marker material such as a catalyst in the retaining features, with subsequent growth thereon; or
  any partially or substantially UV curable polymeric material.

For applications requiring efficient electrical conduction the former is preferred, although the latter may be employed. Known materials therefore include any suitable metals, alloys, and/or composites of metallic and non-metallic magneto or electrically active materials. The present invention is therefore characterised by the integration of functionalising materials in microstructures which may be prepared in convenient manner with use of micromoulding technology. Reaction micromoulding or writing is preferred, for example micromoulding such as advancing line of contact UV embossing technology as disclosed in International Patent Applications PCT/GB94/02118 and PCT/GB96/01096 the contents of which are incorporated herein by reference, or progressive writing or dispensing UV freeforming technology using a suitable writing or dispensing nozzle associated with freeforming methods for example as in P D Calvert et al, Chem Mater 1997, 9(3), 650–663 "Chemical solid freeform fabrication: making shapes without moulds". Moreover, multifunctional microstructures comprising non-polymeric, non-UV curable or polymeric, optionally UV curable functionalising materials in addition to polymeric at least partially UV curable relief forming materials may be produced by a novel adaptation of the UV embossing technology as disclosed in International applications above referred, in particularly advantageous manner. Specifically, the microstructure and method for the production thereof, according to the present invention have enabled the realisation of a whole range of new uses, by virtue of the unique nature thereof.

The relief forming material as hereinbefore defined may optionally comprise or include at least one functionalising material as hereinbefore defined which is the same as or different to, and is advantageously different to that deposited in the at least one retaining feature.

Functionalising material as herein referred comprises any material adapted for energy differentiation (separating materials of different phases for example bydielectrophoresis, separating or shielding light of selected wavelengths), energy manipulation (transporting materials by capillary action), energy conversion between different forms, transformation of energy density, (transformation of voltage, wave length conversion of light and the like), spatial transformation (transportation of energy, power transmission, communication and the like) and transformation along a time scale (energy storage, data storage, for example batteries or magnetic data storage and the like). Examples of energy conversion which may be particularly attractive for microsystem applications are disclosed in "An Introduction to Speciality Polymers", ed. Norio Ise & Iwao Tabushi, Cambridge University Press, 1983, Chapter 4 "Polymers having Energy Converting Capability", Shigeo Tazuke, and in particular include mechanical to electromagnetic conversion (Piezoelectricity, sound pressure to electricity conversion in microphones and pickups), thermal to electromagnetic conversion (switching device by means of thermo-optic effect), photo to chemical conversion (photovoltaic or photo electric effect), chemical to electromagnetic conversion (various sensors with functionalised electrodes). Conversions may be for sensing, actuating or for reading or monitoring purpose. By implication therefore functionalising materials include any materials having properties selected from electric, magnetic and ferroelectric.

In a first object the invention provides miniaturised microstructures as hereinbefore defined wherein miniaturised fine lines are substantially free from distortion effects by virtue of highly precise production techniques.

In a further object the present invention provides miniaturised microstructures as hereinbefore defined comprising miniaturised fine lines providing track density comparable with high pin out densities of currently miniaturised microchips to enable direct chip on board mounting.

In a further object the present invention provides miniaturised microstructures as hereinbefore defined comprising miniaturised fine lines providing automatic identification such as bar codes which may be interrogated optically, magnetically, by microwave or other means.

In a further object the present invention provides miniaturised microstructures as hereinbefore defined comprising miniaturised fine lines having low density fine line coverage adapted for high optical transmission for displays and the like, combined with features of security, reducing unauthorised, indirect line viewing, and the like.

In a further object the present invention provides miniaturised microstructures for use in multifunctional applications and/or enhancing efficiency of application by use of miniaturised fine lines associated with the relief shape and/or aspect ratio derived from at least one retaining feature of the micro structure.

In a further object the present invention provides miniaturised microstructures comprising three dimensional microcircuitry devices, by use of connection in a plane of layers as hereinbefore defined and between additional planes of such layers, or by use of highly flexible circuitry which may be folded into a three dimensional shape for miniaturisation of products, and/or association with other multifunctional modules in fault tolerant manner with improved robustness of circuit tracks to failures, with provision of progressive failure safeguards.

In a further object the present invention provides miniaturised microstructures in the form of an integrated microsystem comprising fine line circuitry together with associated packaging wherein additional functionality is provided by the packaging, and/or the packaging comprises a micro relief array or microsystem as hereinbefore defined for efficiency of production.

In a further object the present invention provides microstructures adapted for use with miniaturised and conventional systems for multifunctional and conventional purpose.

In a further object, the present invention provides miniaturised microstructures comprising fine line arrays in which shape and/or conductivity is adapted to provide desired electromagnetic signature for a signal reception or broadcast.

In a further object, the present invention provides miniaturised microstructures adapted for use as microelectrodes in bio-electrical applications, in the order of molecular level for compatibility with chemical and/or biological active functions, adapted for measurement as bio-sensors with enhanced measurement efficiency per unit area by virtue of the compatibility of the electrode size with the particle size or molecular level dimensions of the system or for separation purposes.

In a farther object the present invention provides miniaturised microstructures adapted for use as masks for lithography, providing enhanced light opacity associated with the high quality reproduction rendered by the high quality fine line structures of the invention.

In a further object the present invention provides miniaturised microstructures adapted for use as sieves and capillaries for material separation and transport, providing enhanced fault tolerance and stability to heat, solvents and the like by virtue of the properties of the electroactive functionalising material used for the fine lines and arrays and the employment of audio and RF fields via microelectrodes to manipulate the dielectric properties of transported material using the phenomena of dielectrophoresis and travelling field effects.

The nature and arrangement of the various layers of microstructures of the invention are now described in more detail.

The second layer of relief forming material may comprise any organic or inorganic material, or an organic precursor of an inorganic material such as a sol-gel. An organic material is suitably a polymer. The second layer may form a continuous surface or overlayer for the first layer having a minimum and a maximum thickness, or may comprise discrete relief features retained thereon. Accordingly the third layer may be co-continuous with the second layer in manner that it is isolated from the first layer or that both second and third layers are in contact with and are retained on the first layer.

The second layer may be dispensable, for example may be used as a mould to create the deposited microfeatures, and thereafter removed to give deposited microfeatures projecting from the surface of the first layer.

The first layer may also be dispensable, in which case a self-supporting microstructure of functionalising material may be obtained which may subsequently be mounted in association with additional materials or modules as appropriate.

Reference herein to a first, second and third layer may be to a single or plural such layer, provided as a single or plurality of the relevant type of material.

Preferably the first layer of first substrate has a receptive surface capable of retaining the functionalising material, where the third layer contacts the first layer. Alternatively the continuous overlayer of relief forming polymer has a receptive surface at its minimum thickness regions, capable of retaining the functionalising material, where the third layer is isolated from the first layer.

Relief features may be of any desired geometry according to the function to be performed, for example may comprise a plurality of continuous, stepped or otherwise profiled structures.

Reference herein to a retaining feature is to a feature formed between at least two relief features, defined by the relief features as its side walls and defined by the first layer or the minimum overlay thickness of second layer as its base, in manner adapted to contain the functionalising material between its side walls, thereby substantially preventing undesired contact with material contained within another retaining feature, or with other materials.

A retaining structure may be in the form of a well or channel, i.e. an elongate or otherwise structure which may be open-sided along part thereof, for example at its elongate ends, or otherwise. A well may be contained between relief features and may additionally include further relief features, i.e. a retaining feature may be continuous about and between a plurality of relief features to provide a negative of a traditional array, or may be non-continuous between one or more continuous relief features to provide a traditional array.

A channel may suitably comprise a straight, curved or angled track which may be branched, unbranched or may be continuous for a portion thereof, i.e. comprise a closed circular, elongate or other geometrical loop, or any combination thereof. A plurality of channels may be arranged in parallel, concentric, diverging, interlocking manner or the like or any combination thereof. Preferably the channels comprise a pattern which may be of use to provide a means for sensing, receiving or transmitting a signal in desired manner, more preferably the channels have a form selected from a microwave antenna or waveguide. Alternatively a well may suitably comprise any cross-section, profile or shape, for example a continuous or polygonal shape, of uniform or otherwise depth. Preferably wells may be used to construct sensors, for example bio or magnetic, interconnect junctions, interchannel holes and the like.

It is a particular advantage that channels may be adapted for addressing wells in the form of arrays such as, liquid crystal display pixels or magnetic arrays for information storage or ferroelectric materials for acoustic imaging or arrays of biological materials and the like at the junctions thereof, pairs of electrodes, optionally in kit form for assay purpose, magnetising field source and the like.

The substantially co-continuous second and third layer may present a co-continuous surface, whereby the relief provided by the second layer is contained substantially completely therein, or may have a substantially non continuous surface, whereby the third layer protrudes above or recedes below the surface of the second layer.

The second layer may comprise a substantially profiled surface, whereby relief features protrude to differing heights above the first layer, or may have a substantially uniform surface whereby relief features protrude substantially uniformly above the first layer. Similarly where the second layer comprises an overlay having a minimum thickness over the surface of the first layer, the minimum thickness may be uniform, whereby the base of each channel is substantially uniformly spaced from the first substrate, or may comprise a varied overlayer minimum thickness, whereby the base of any one channel may be spaced by a lesser or greater thickness from the first layer. This may be of particular advantage in the event that it is desired to provide a surface relief in the third layer, whereby the material protrudes, recedes or is co-continuous with the surface of the second layer.

The microstructure may comprise an immersion layer, which may be partially or substantially completely covering and in contact with the surface of the second and third layers. An immersion overlayer suitably serves to seal the element, or selected portions thereof. There may be a plurality of immersion overlays, covering a plurality of regions or sections of the elements surface. This is of particular advantage, for example in micro-electrical application enabling embedding of a semi-conductor chip or metallic structure.

The microstructure may comprise a plurality of microstructures as hereinbefore defined in repeating aligned or inverse co-planar arrangement. In an aligned arrangement, the first layer of first substrate may comprise the immersion overlay of a co-planar adjacent microstructure, whereby a selective immersion overlay covering a region of the adjacent microstructure may be employed in manner to provide contacting connection between material comprised in the third layer of adjacent microstructures. Contacting connection may be provided directly for protruding third layers, or via interconnects, located in interplanar holes. But this means interconnects are provided in three dimensions, in and between the plane.

Alternatively or additionally a plurality of microstructures in inverse co-planar arrangement may be substantially or partially the same and may be so placed that at least some of the retaining features of the third layer of respective microstructures are matched such that they can form a composite component. By this means interconnects are provided in a sandwiched microstructure.

Alternatively a plurality of microstructures as hereinbefore defined may be in aligned or inverse arrangement in non contacting insulating co-planar manner for purpose of compact positioning of independent elements within the microstructure. In these arrangements, the overlay may be provided as a dedicated overlay or as the first layer of an adjacent microstructure, and is insulating, at least at the direct line between adjacent electrically conductive regions.

Microstructures may comprise relief features of any desired aspect ratio suitably in the range depth:width of 200:1, preferably 100:1, more preferably 50:1 to 1:20, for example 25:1 to 1:10. High aspect ratios may be advantageous to maximize conductivity as a function of line width, i.e. for a given retaining feature, such as track, cross section. In a further advantage it has been found that high aspect ratios may also be employed for display screens and the like for reducing sideways vision or viewing angle, thereby providing privacy and security to the user.

High aspect ratio retaining features may be constructed using either method as hereinbefore defined, and preferably with use of the embossing technology as hereinbefore defined. Accordingly functionalising material is suitably introduced in manner to substantially fill the retaining features, either in the form of a polymeric material which is subsequently UV cured, or in the form of a precursor of a functionalising material comprising a catalyst which substantially lines the retaining features and which is subject to growth by suitable means such as electroless deposition, electroless deposition and optionally subsequently electroplating or by electroplating onto an exposed metallic first layer.

As hereinbefore defined a microstructure of the present invention may be capable of use as an active component in a micro-optic, micro-fluidic, micro-electrical, micro-acoustic, micro-magnetic, micro-biological or micro-mechanical device.

Accordingly it will be apparent that the optional or dispensible first layer may be of any desired nature and geometry according to the desired function to be performed. For example the first layer, including an optional support substrate, may perform a support function, optionally as integral packaging for the device of the inventions, whereby it may be rigid or flexible, comprise additional functional components, for connection to or association with the microstructure of the invention or for the construction thereof, may be of any shape such as flat or curved planar, hollow or solid, cylindrical or the like may be patterned, such as by surface roughening, provision of contours or other mechanical, fluidic, acoustic, electric, magnetic, optical or biological component wherein the relief feature(s) is/are suitably applied to a surface thereof.

The first layer where present, may provide an additional feature for the operation of or construction of the microstructure.

The first layer may be supported by a suitable support substrate which may be subsequently removed from the first layer. However, it is preferred that the first layer is self-supporting or is associated with a support surface of desired geometry, for a desired application. Suitably the first layer is comprised of any suitable material for the intended application which may be known in the art for example it may be a polymer film optionally coated or in the form of a laminate, with polymeric or non-polymeric material which may be patterned (in particular a film formed from polyester, such as PET or PEN, polyolefin such as polypropylene or PE, halogenated polymers such as PVC, polyamide such as nylon, aromatic polymers such as polyethersulphones and ketones PES, PEES, PEK, PEEK, heterocyclic aromatic polymers such as polyimide or a known biodegradable polymer, e.g. poly(hydroxy butyrate) wherein the functionalising material may be a sputtered metal or metal oxide coating or metal foil such as aluminium pre-treated to render it void-free); a material selected for its optical transparency at certain wavelengths for example ZnSe or Germanium which are capable of operation in the infra-red region between 2 and 15 micron; silicon; high temperature resistant inorganic metal oxide or ceramic such as titania or (fused) silica, e.g. glass; natural or synthetic paper product such as a wood pulp or synthetic card or paper; or a metallic electrically conducting material adapted to form an electrical contact and direct metal growth by electroforming at the base and/or walls of retaining features, and suitably insulated by an additional insulating support layer.

For certain applications, for example where semiconductor components are mounted onto the microstructure and from which it is desirable to dissipate heat, the first layer may be coated with a layer of diamond or similar material with a high thermal conductivity, which may optionally be patterned or have any form as hereinbefore defined for the support layer. It is a particular advantage that microstructures of the invention may be adapted for minimised heat generation by optimising conductivity of electrical contacts.

The receptive surface of the first layer may comprise a micromachined surface providing for roughening with associated adhesion, wetting and the like properties for relief forming polymer and/or functionalising material or its precursors in the form of resins, pastes, liquids and the like, or may be coated with a suitable bonding agent, e.g. where the first layer is of glass, a silane coupling agent, or an acrylic polymer containing for example acid and/or amide groups which serves to more firmly anchor the relief feature and/or functionalising material to the first layer.

Coating of the base and/or walls of the retaining features may be achieved as a continuous layer applied to the first layer prior to forming the second layer thereon, but is advantageously achieved as a layer about the relief features which may be created by replication in suitable manner during or subsequent to the formation of the relief features.

The selection of the relief forming material will be dependent on the intended use of the microstructure and includes polymers or composites such as silica filled, light curable resins such as those used in dentistry and those for rapid prototyping by stereolithography, UV curable liquid crystal resins, photocationic epoxy resins and those optically transmissive resins as described below, photoresists including photoimageable polyimides, thermosets, 2 part resins, thermoplastics, and (partially) inorganic materials such as sol-gel processable materials photoimageable glasses and ceramic precursors.

Polymers are preferred whose processing characteristics and properties can be altered by the extent of cure or can be multilayered such that each layer is tailored to the function required at the interfaces provided. For example, the lowest layer of a plural second layer might be tailored to provide adhesion to the first layer or is swollen or partially swollen by solution containing a growth medium to promote access of the growth medium to the target medium. Alternatively a lower mechanical modulus material might be selected at the interface to a low expansion coefficient material or embedded component to promote stress relief. Alternatively the upper layer may be selected to provide specific surface chemical properties for the production or use of the microstructure, such as hydrophobic properties comprised in the surface layer about the relief features and/or hydrophilic properties in the relief features to aid in wetting by precursors of functionalising materials as hereinbefore defined; or such as inertness to biological interactions or specific binding groups for attachment of biological reagents.

Surface modification of the surface relief of the second layer for example introduction of reactive groups such as —OH, —COOH, —SH OR —NH2 can be generated by means of low temperature plasma processes, wet chemical treatment or grafting from the liquid or vapour phase or by inclusion of the groupings as pendant groups attached to the reactive monomers or polymers used to form the relief. Suitable plasma processes are described by H V Boenig in "Fundamentals of Plasma Chemistry and Technology". Technology Publishing Co., Inc., Lancaster, Pa., 1988 and "Advances in Low Temperature Plasma Chemistry, Technology, Applications", same author, year and publisher.

Thermoplastic polymers suitable as second layer polymers for thermal embossing and micromoulding include polypropylene, polystrene, polyether sulphone, poly(ether ether) ketone (PEEK), poly(ether) ketone (PEK) and fluorinated polymers particularly amorphous polymer based on tetra fluoroethylene, hexafluoropropylene and 2,2 bistrifluoromethyl-4,5-difluoro-1,3-dioxole sold under the trade names Teflon PTFE, PFA, FEP and AF.

A wide range of thermoset may be used to form surface relief. Typically a coating of the resin would be applied to the first layer and partially thermally cured to achieve a rheology or "green state" suitable for embossing. After embossing further heating completes the cure either with the relief in contact with the mould or if the relief is sufficiently stable deformation in the absence of the mould. Conditions of cure can be usefully manipulated to be non uniform such that the upper parts are more completely cured than the lowest. Incomplete cure aids swelling and access to the target material.

Preferred thermoset resins include addition polymerisation resins such as acrylics, vinyls, bismaleimides and unsaturated polyesters; condensation polymerisation resins such as formaldehyde condensates reacted with urea, melamine or phenols, cyanate and isocyanate resins, functionalised polyesters, polyamides or polyimides, epoxy resins and mixtures of two or more of these. Epoxy resins are suitably the product of at least partly curing a resin precursor using a curing agent and possibly a catalyst. The resin precursor is typically the mono or poly-glycidyl derivative of: aromatic diamines, aromatic monoprimary amines, aminophenols, polyhydric phenols, polyhydric alcohols and polycarboxylic acids. Resins which are liquid at ambient temperatures are preferred as sold by for example Ciba Geigy.

When optically transmissive, the relief forming polymer may be selected from those known in the art including those developed as light curable adhesives for joining optical components for example those sold under the name LUX-TRAK (tradename), those developed for polymer optical fibre fabrication and those developed for optical recording using polymer photoresists. In particular the optically transmissive relief forming polymer may be formed from a suitable resin for example halogenated said deuterated siloxanes, styrenes, imides, acrylates and methacrylates such as ethyleneglycol dimethacrylate, tetrafluoropropylmethacrylate, pentafluorophenylmethacrylate, tetrachloroetylacylate, multifunctional derivatives of triazine and phosphazene.

In order to facilitate the curing of the resin it is preferred to use an initiator, for example a thermal and/or photoinitiator. Typically, when used, an initiator is present in the resin at a concentration from 0.1 to 3.0% by weight, and preferably from 0.5 to 2.0% by weight. Suitable photoinitiators include 2-methyl-1-[4-(methylthio)phenyl)-2-morpholino propanone-1 (Irgacure 907), 1-hydroxy-cyclohexyl-phenyl ketone (Irgacure 184), isopropylthioxanthone (Quantacure ITX), Camphorquinone/dimethylaminoethylmethacrylate and suitable photocationic initiators. Similarly a suitable thermal initiator is tert-butylperoxy-2-ethyl hexanoate (Interox TBPEH).

Suitable photo-cationically curable epoxy resins include those sold under the trade name Cyracure, for example, 3,4 epoxycyclohexylmethyl-3,4-epoxycyclohexane carboxylate and bis-(3,4-epoxycyclohexyl) adipate. Suitable photoinitiators also sold under the trade name Cyracure include mixed triarylsulphonium hexafluoroantimonate salts and mixed triaryl sulphonium hexafluorophosphate salts.

The second layer polymer composition may contain additives such as toughening agents and fillers such as titanium dioxide, talc, boron nitride, mica, pigments and stabilisers such as phosphates.

The third layer may comprise an UV curable, polymeric material or non UV curable non polymeric targeted growth material, as hereinbefore defined. In a particularly preferred embodiment the invention provides a means of depositing a third layer comprising a material which is substantially incapable of being formed or moulded into a desired form whereby it may be retained within a channel as hereinbefore defined, and of being subsequently treated to render the material in solid form. It will be appreciated that different means must be employed to provide such third layer material than known for formable, UV curable materials, for example as disclosed in co-pending International Patent Application No. PCT/GB96/01096. Specifically the invention provides for deposition of targeted growth materials which may be targeted and grown in situ.

Preferably the functionalising material of the third layer of the microstructure of the invention comprises a material which is introduced into the retaining features in a first form and is subject to a treatment to render it in the form of a solid layer. More preferably the material is the reaction product of a first target precursor and a second growth precursor, which serves as a source of matter for the development or growth of a layer of material at a site supporting the target material.

The functionalising material or a precursor thereof may be deposited either directly on the base and/or walls of the retaining feature(s), or indirectly by deposition as a layer on the surface of the first layer and subsequently forming relief features selectively on the surface of the layer of functionalising material, with regions therebetween comprising the base of the retaining feature(s) remaining exposed or adapted to be exposed in suitable manner whereby the functionalising material or its precursor is exposed or adapted to be exposed. In a particular advantage of the invention, relief forming features may be formed on the surface of the first layer by use of advancing line of contact UV embossing as hereinbefore referred, whereby a minimum or zero overlay of relief forming material is formed between the features. In this case the overlay may be conveniently removed, if present, by etching or other known means to expose the functionalising material. Preferably precursor of functionalising material comprising catalyst deposited as a layer in this manner is partially exposed at the central portion only of the base of retaining feature(s) to whereby an electrical contact may be made with the layer of catalyst, in order for growth thereof within the retaining feature(s), but without weakening the bond between the relief feature(s) and the first layer.

Precursor of functionalising material comprising target material is preferably a fluid liquid or paste which may be contacted with and retained on the base and/or walls of a retaining feature as hereinbefore defined, in suitable manner optionally as an integral stage in the production of the microstructure. Preferably a growth material is a fluid gaseous or liquid material with which at least the portion of the microstructure as hereinbefore defined comprising the base and/or walls of a retaining feature contacted with target medium may be contacted in manner to provide catalytic reaction for the deposition of the material of the third layer.

The target and growth media may be selected from any suitable materials known in the chemical, bio-chemical and biological art. Preferably the target material comprises a catalyst, cell culture or the like for which the growth medium comprises a fluid adapted for catalytic reaction with deposition in association with the catalyst, for example comprises a solution of metal salts, biological replicating media and the like. More preferably the target medium comprises any catalyst known in the art of electroless deposition of a (semi) conducting material, and the growth medium comprises, in combination or sequence, one or more solutions of metallic salts known for electroless deposition or electroforming (for thicker coating).

For example, electrochemical catalysts and growth media are disclosed in "Modern Electroplating", Ed. F A Lowenheim third edition, Wyley, N.Y., 1973, Pp 637–671, "The kinetics of PdCl2/SnCl2 Activating Solution for electroless plating" Wang & Wan, Plating and Surface Finishing 69 (8) 59 (1982) the contents of which are incorporated herein by reference. Sn—Pd colloidal catalysts are available commercially (The Shipley Co).

Catalysts are preferably selected having molecular magnitudes of substantially less than the aperture of retaining features. Alternatively bulky catalysts such as colloidal catalysts may be formed in situ, for example a first component is provided on the base and/or walls of retaining features and contacted with a second component. This has the particular advantage of improving wetting.

Light activated catalysts are known and may be employed with direct illumination of a desired wetted region, for example using the retaining features for deposition of catalyst or for providing a boundary between catalyst deposited universally across the surface of the second layer, with growth of functionalising material restricted to the illuminated retaining feature regions.

Catalyst is preferably detectable in manner that catalyst may be selectively removed from regions in which growth is not desired, or growth initiation may be directed to regions in which catalyst has been selectively or otherwise deposited. This provides advantageously for inhibition of undesired lateral growth. Preferably catalyst is coloured with use of suitable dyes and the like.

The magneto or electrically active component of functionalising material is suitably selected from the group consisting of metals from Groups Va, VIa, VIIa, VIII, Ib, IIb, IIIb, IVb, Vb, VIb, and the actinides of the Periodic Table of the Elements, for example, V, Cr, Mo, W, Mn, Re, Fe, Co, Rh, Ni, Pd, Pt, Cu, Ag, Au, Zn, Cd, Al, C, Si, Sn, Pb, Sb, P, Te, Th, and alloys thereof. Metals may be selected according to the intended use, for example magnetic metals (Fe-based), opaque metals for mask construction, or conducting metals, e.g. a solderable alloy (e.g. Cu or Ni), indium tin oxide (ITO) or gold, optionally as a flash or coating of a copper or nickel layer, so that an electrical contact can be made to a semiconductor component located on the surface of the microstructure.

Alternatively the functionalising material of the third layer comprises any known UV curable magneto or electrically active polymer, for example selected from but not limited to processable forms of polyaniline, polyvinylene, polythiophene, polypyrrole, polyphenylene, polyphenylenevinylene and precursors, analogues or copolymers thereof.

A plural third layer may be advantageously employed being of similar or different materials. For example metals or polymers may be coated or rendered in different forms, to aid with corrosion resistance, oxidation stability, surface bonding, conductivity enhancement, thermal expansion compatibility, for selection of inherent processing conditions to enable property control, such as stress management and the like.

Known techniques for preventing void formation, for example using ultrasound, may be employed with use of polymeric or non-polymeric metals.

An overlay of relief forming polymer may be formed over the first layer using the advancing line of contact UV embossing technology as hereinbefore defined. The overlay may be reproducibly controlled to obtain a thickness appropriate to the function of the microstructure and may, even in those instances where a minimum overlay is desired, usefully serve to planarise the receptive surface. In some instances, e.g. in micro-mechanical devices, a relatively thick and uniform overlay may be desirable for example to secure the relief forming polymer firmly to the first layer. In other instances, it is desirable to minimise the thickness of the overlay such that it does not interfere significantly with the functioning of the microstructure, i.e. the overlay is functionally insignificant. Preferably, the functionally insignificant overlay has a maximum thickness of less than 1.5 $\mu$m, preferably less than 1 $\mu$m, and particularly less than 0.5 $\mu$m over the surface of the first substrate. The average thickness of the functionally insignificant overlay is preferably less than 1 $\mu$m and particularly less than 0.5 $\mu$m. This has the particular advantage of minimising wavefront error, electrical conductivity, resistance or contacting, thermal expansion or thermal conductivity, magnetic field influence and the like. It may also be desirable to coat the first layer with target medium as hereinbefore defined, and subsequently form the second layer, whereby the target and growth media must be capable of reaction or multiplication despite any intermediate over lay resulting from the second layer formulation.

A microstructure of the invention may comprise an immersion layer as hereinbefore defined, in particular where it is desired to create three dimensional microstructures. Such layer may serve for any desired purpose, for example thermal or moisture insulation, contact insulation or connection for the purpose of separating or contacting the third layer material from or with an activating source, such as an electrical supply or contact, and the like. The immersion layer may be transparent, opaque or reflective, according to the desired requirements. Suitably therefore the immersion layer comprises any material as hereinbefore defined for the first substrate or relief forming polymer.

The immersion layer may also be supported at its upper face by a suitable, optionally releasable, substrate. The immersion layer may be superimposed on the at least one feature by any suitable means, e.g. lamination.

In a further aspect of the invention there is provided a method for the production of an microstructure as hereinbefore defined. Preferably the method of the invention comprises providing (optional or dispensable) first and (optionally dispensable) second layers of a microstructure as hereinbefore defined comprising retaining features and providing third layer comprising functionalising material as hereinbefore defined, wherein the functionalising material or its precursor is deposited in manner to substantially fill or line the base and/or walls of retaining features, prior to or substantially simultaneously with or subsequent to the formation of the relief features.

More preferably the method comprises forming relief features and depositing functionalising material or its precursor in in-line manner, optionally substantially simultaneously. It is a particular advantage of the present invention that the formation of the third layer selectively within the retaining feature(s) enables accurate positioning of the third layer.

In a first embodiment, a method as hereinbefore defined comprises the stages a) providing a first, optionally dispensible, layer as hereinbefore defined;

b) contacting the surface or part thereof with a precursor of targeted growth functionalising material comprising target medium as hereinbefore defined;

c) providing a second layer of a relief forming polymer over the receptive surface;

d) providing a plurality of relief features formed in the second layer of relief forming polymer to provide at least one retaining feature as hereinbefore defined with an overlay of relief forming polymer in the base of the retaining feature; and e) contacting with a growth medium as hereinbefore defined in manner to provide a third layer of at least one substantially non UV curable, non polymeric functionalising material contained within and substantially or partially filling or lining the at least one retaining feature, as hereinbefore defined;

wherein the overlay is substantially zero to allow contact of target and growth medium.

It will be appreciated that the marking for the third layer is provided by selective masking of the target medium, by relief features formed thereupon. Removal of non-zero overlay is preferably be means of etching. Stage d) is preferably by establishing an electrical contact with the layer of target material and contacting target material exposed within the retaining features with growth material. The method may be of advantage for its simplicity, for use with materials and substrates which are capable of acceptable retention with the interposition of a target medium as hereinbefore defined. It is of advantage that a plural third layer may be provided by appropriate repeat of stage d).

In a second embodiment, the method of the invention comprises the stages of a), c), and d) as hereinbefore defined;

b1) contacting the base and/or walls of the at least one retaining feature with a functionalising material or precursor thereof as hereinbefore defined by means of selective or non selective deposition; and e1) contacting with a growth medium as hereinbefore defined in e) above or curing with a source of UV to provide third layer as hereinbefore defined.

It is a particular advantage that the method of the second embodiment enables selective marking for a third layer, in particular with the use of materials which enable acceptable wetting of the relief forming polymer with target medium, by means of contact printing from in embossing tool using the advancing line of contact technology as hereinbefore referred.

Alternatively the method enables selective marking by contacting the surface of the second layer with a target medium as hereinbefore defined for total or regional wetting thereof and displacing target medium from high profile regions of the relief features by suitable.

Wetting of the base of the retaining features in the second layer may be improved by rendering the surface roughened by means of micromachining, chemical surface modification or the like, whilst smoothing of the surface of the second layer may, provide for more easy removal of target medium.

Alternatively a sacrificial layer of removable material may be provided at the surface of the second layer, such as water, grease or oil based material, prior to printing of target material, such that removal of the sacrificial layer by wiping achieves the desired removal of target medium.

Displacement of target medium is suitably achieved by means of wiping the surface of the second layer with absorbent material, optionally with absorbent material having a displacing medium absorbed thereon. Preferably wiping is by means of a damp tissue or impregnated tissue.

This method is of particular advantage for use with materials which are not capable of providing suitable wetting simultaneously with the formation of the relief features, or wherein it is required that immersion is for a prolonged period in order to improve absorbtion of target media.

Most preferably in a third embodiment the third layer as hereinbefore defined is provided by the following steps:

B1) forming a line of contact between the second layer and at least one mould feature formed in a flexible dispensing layer;

B2) applying sufficient of a functionalising material or its precursor to substantially or partially fill or line the at least one mould feature, along the line of contact;

B3) progressively contacting the receptive surface with the flexible dispensing layer such that the line of contact moves across the receptive surface and sufficient of the functionalising material or its precursor is captured by the mould feature so as to substantially or partially fill or line the mould feature; and optionally, thereafter B4) releasing the flexible dispensing layer from the at least one relief feature.

A plural third layer may be provided in suitable manner for example by repeat of the method.

The pressure is applied along the line of contact by any suitable means. Suitably, the pressure is applied using an advancing bar or flexible blade under a compressive load which may be drawn along the surface, or using a roller under a compressive load which may thus on advancement or rotation retain the resin in the nip formed by the bar, blade or roller between the flexible dispensing layer and the surface. It is therefore preferred that the resin is cured at the nip as the line of contact progresses across the surface.

The flexible dispensing layer is preferably a polymer film into which the mould features have been embossed. Such an embossed film is preferably transparent to UV light, has high quality surface release properties and is capable of remaining dimensionally sound during the moulding process. Conveniently, such an embossed film may be formed by (a) forming a master pattern having a contoured metallised surface which conforms to the required relief structure, (b) electroforming a layer of a first metal onto the metallised surface to form a metal master, (c) releasing the metal master from the master pattern, (d) repeating the electroforming process to form a metal embossing master shim and (e) embossing the relief structure into a polymer film so as to form the desired mould features.

Additionally, the embossed film, if retained on the receptive layer, may serve as a protective layer which can be removed at a later time.

A further advantage of making the microstructure by the above method is that the flexible dispensing layer may be treated with any suitable material to provide a third layer adapted for any desired purpose. In addition, selective treatment with additional materials may be achieved, for example a masking or screening medium, a priming medium, or a medium conferring any desired optical, electrical, mechanical, biological, magnetic or fluid properties or the like which may be transferred by contact reproduction to the first layer or the overlayer as desired, for example to selected regions thereof on or about the relief features, using a modification of known techniques for example as described in Appl. Phys. Lett. 68(7), 1022–23.

A further advantage of the above method is that the same flexible dispensing layer may be used for embossing and deposition of functionalising material.

Choice of method for deposition of functionalising material may be made according to the nature thereof. For example with use of high aspect ratios, the use of electroless or electroplating may be preferred.

The surface relief may be produced by a direct writing method for example using a fine nozzle to dispense photocurable resin (nozzle sizes of the order of 100 micron (internal diameter) can be used or ink jet printing heads or pen plotters). The pattern can be written using an x-y translation driver and can be computer controlled via a design drawing programme such as Autocad. The resin can be cured via a point of contact as previously described. The target medium can be similarly written in the areas of the relief as required. This method is useful for rapid prototyping of structures.

Alternatively the first and second layers may be provided by any means as known in the art, for example as hereinbefore referred. Preferably the first and second layer are provided by the process of co-pending PCT/GB96/01096, the contents of which are herein incorporated by reference. For this purpose a mould may be used, prepared by the known techniques of the above International patent applications.

The present invention is illustrated in non-limiting manner by reference to the following figures.

FIGS. 1 and 2 show microstructures of the invention in cross section, elevation and plan view, in various embodiments.

Figure 2A:
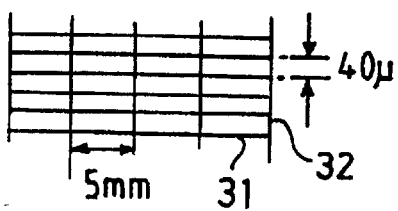

In FIG. 1a) is shown an embodiment of a microstructure of the invention comprising optional support layer (not shown), first layer (16), second layer (17) having relief features (18) thereon forming channels (19) therebetween. The channels comprise a third layer of material (20) as hereinbefore defined generated from a target precursor (21) and optional immersion overlayer (22). Layer (20) may be continuous across the base thereof or otherwise, for example a sensor may comprise two lines of electrically active material along the length thereof, and the channels may be filled with biomaterial to be sensed, whereby contact between lines is made via biomaterial, enabling a measurement to be derived.

Further embodiments are shown in FIGS. 1b)–l) in which reference numerals are the same. In FIG. 1b is illustrated a microstructure comprising a plural layer of second material (24) and third material (23), which are ideally suited tailoring properties such as solvent swellability (to encourage access of target precursor to channels), or thermal stress relieving purpose, or for different micro properties, such as with a plural third layer obtained by sequential or multiple dipping in Cu, Ni, Au and the like for improved properties of adhesion, corrosion resistance and the like of highly conducting materials such as Cu. In FIG. 1d) and e) are showed products of FIG. 3 having zero or positive overlay (27,28). In FIG. 1l) is shown product of FIG. 4 or 5 having target material printed onto base of channels and functionalising material grown thereon. In FIGS. 1i) and j) are shown a symmetrical device which is able to resist deformation by difference in thermal expansion of the component layers and an arrangement wherein the first layer is insulated by heat or moisture insulating layer from a further outer layer, in manner adapted for use in packaging of a microsystem without need for dedicated support means within the packaging. The devices may have any desired aspect ratio or profile as indicated in FIGS. 1f) and g) which may be partially or completely filled with a single or plural third layer, optionally with surface roughening or profiling of the channel base, and with zero or positive overlay (27,28). FIG. 1i) may comprise an acoustic, electrical or optical device according to the invention, comprising a semi-conductor or an acoustic or optical wave guide (25) provided as a further component between two co-planar microstructures of the invention. Switching is enabled for example by heating of a waveguide by means of metal tracks provided for the purpose of charge conduction. An acoustic device may comprise as third layer, Pb, Zr, La or Tantalate as polymer composite in the form of a microparticulate dispersion.

In FIG. 1h) and i) microstructures are suitably glued with anisotropic conducting or with non-conducting adhesive (26).

In FIG. 1k) is shown an embodiment for micropositioning of microstructures. Embodiments may be of use in a liquid crystal display or in bio-assay using electrical means in the form of an array of microreaction chambers superimposed upon a microcircuitry array.

In FIG. 1m) is shown an embodiment according to FIG. 1e), in which etching of positive overlay (28) enables contact to be established with exposed functionalising material in the base of the retaining feature. In FIG. 1n) is shown the microstructure having high aspect ratio as hereinbefore defined, with zero or positive overlay (27,28) typically of ratio in excess of 1, for enhanced-conductivity, or for reducing unauthorised, indirect line viewing, but with low density fine line coverage and/or high optical transmission, in electrical, and/or displays applications. The structure is suitably made by means of lining the walls and base of channels with catalyst, and depositing functionalising material by electroless deposition or electroplating, depositing functionalising material substantially filling the channels.

In FIG. 1p and q) are shown microstructures for connection to microchips by flip chip bonding with solder or conducting adhesive connects or with rough edge connects using non conducting adhesive. A microstructure 1p) may be a flexible interposer to fan out chip pins to the standard pitch used in conventional flexible circuit boards, for example as chip scale packaging. Bonding may be by soldering using lead-tin or preferably gold-tin alloy solder, by cold curing or other techniques.

In FIG. 1r) is shown a three dimensional structure having a first plane of co parallel channels, perpendicular aligned with one or more channels in a second plane, which may be contained in a conducting or non conducting second layer or overlayer.

In FIG. 2a) is shown in plan view the scheme for an electrically conductive track comprising a low surface density structure of electrically conductive material deposited in manner to provide high conductivity. The structure comprises a plurality of parallel elongate channels (31) suitably of 20 micron width and with spacing of 40 micron, thereby a structure with 5 elongate channels has a cumulative width of 260 micron. The structure comprises additionally at spacings of 5 mm in the elongate direction a series of interconnects (32) linking all elongate channels. The interconnects serve to provide fault tolerance in the event of fault or breakage of any of the fine line channels between any two interconnects, whereby the remainder of the length of any faulty fine line channel continues to function effectively by virtue of the coparallel, intact channels, and the fault is localised.

The scheme may usefully be used requiring low density track coverage as hereinbefore defined in the description but in manner to achieve a desired level of conductivity. Moreover the scheme may be used in a flexible microstructure to particular advantage for any of the hereinbefore defined uses.

Figure 2B:
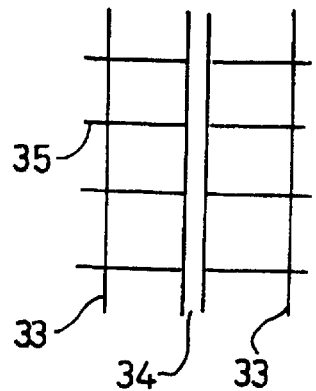

In FIG. 2b) is shown a scheme adapted for use for a microstructure employed as a sensor or actuator in microfluidic, microoptical, microbiological and the like application. Two elongate tracks of electrically conductive material (33) are parallel aligned about a central channel (34) adapted to transport material to be sensed or actuated. Lateral interconnects (35) link each elongate track (33) to channel (34) to provide electrical sensing or actuating in the form of a response wave transported electrically down the length of the elongate tracks (33).

Figure 2C:
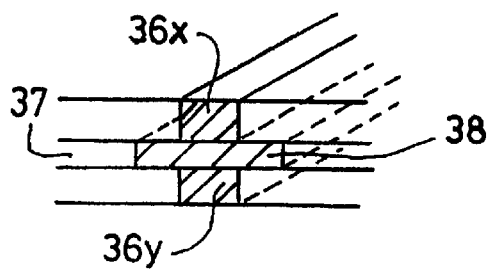
Figure 2C:
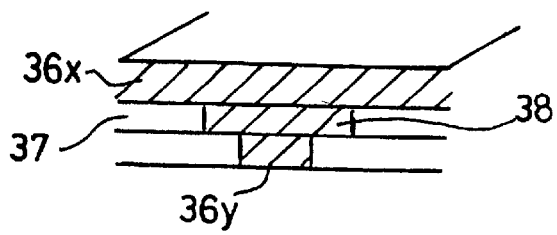

In FIG. 2c) is shown a scheme in elevation adapted for use as a microstructure comprising a three dimensional structure having a plurality of planes of layers as hereinbefore defined. For illustrative purposes adjacent planes comprise a channel of functionalising material (36x) in a first plane and a parallel or perpendicular aligned channel of functionalising material (36y) in a second plane, the structure comprising intervening layer (37) in the form of a first support layer associated with channel (36x) or an insulating overlayer associated with channel (36y). The microstructure comprises an additional interconnecting "via" (38) of functionalising material in contact with channels (36x,y) in layer (37) located to function as an interconnect between adjacent layers. The via is suitably of greater cross sectional area than the channels (36x,y) to facilitate alignment and ensure 100% interconnection is achieved. Functionalising material in channels (36x,y) and via (38) may be the same or different and is suitably the same. The structure is suitably prepared by sequential lamination of layers and solder or conducting adhesive bonding therebetween. Vias may be prepared by drilling, etching or by moulding of laminates comprising through holes or vias which may be subsequently in-filled with functionalising material. A laminate comprising a via may be a relief forming layer prepared using the UV embossing technology of the above referred International applications and subsequently released from the support layer.

Figure 2D:
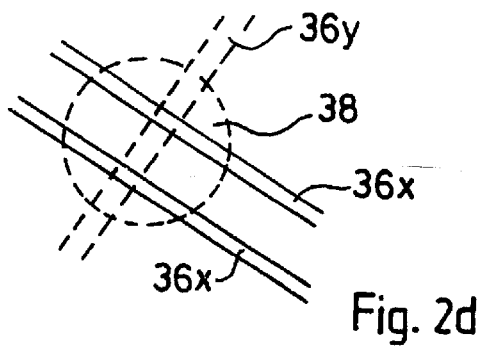

The scheme of FIG. 2c) is shown in plan view in FIG. 2d) in which reference numerals have the same meaning as described for FIG. 2c).

Figure 2E:
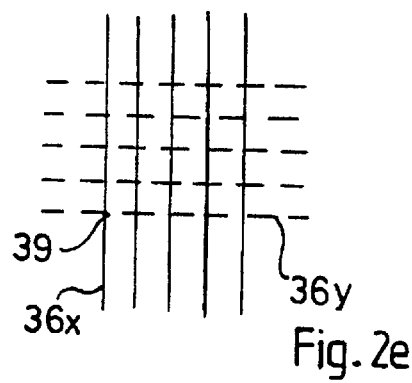

In FIG. 2e) is shown a multitrack structure comprising of channels (36x,y), where all junctions (39) may be addressed by multiplexing. Material between electrodes may be influenced by the field (liquid crystal) or can change the field by altering the gap (for example in a touch sensitive screen).

Figure 2F:
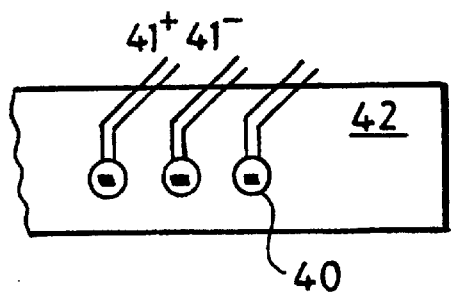

In FIG. 2f) is shown a scheme for an array of functionalising material structures, for use as an array of metal sensors comprising wells (40) each having electrical contacts (41+, 41−) in the base thereof, which act as electrodes to detect a response to a material introduced into wells (40). The array is shown comprised in second layer (42) which may comprise an additional functionalising material, for example a magnetically active material, adapted to transmit a response in desired manner.

Figure 2G:
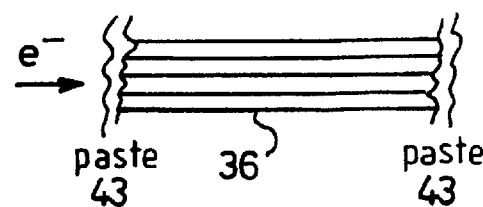

In FIG. 2g) is shown a scheme for a structure comprising a plurality of parallel aligned channels comprising catalyst adapted for deposition of functionalising material by electroplating. Suitable the structure is of the form as shown in FIGS. 1d), 1e and m) or 1l), and a conducting paste or dag (43) is applied at the ends of channels (36). The paste (40) enables current to be passed through all channels (36) which function as an electrode for deposition of a metal such as copper from an electroplating solution. The electroplating process is described in Example 16.

Figure 2H:
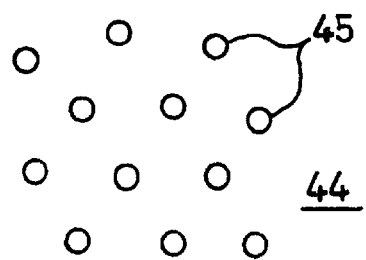

In FIG. 2h) is shown a scheme for an array comprising a continuous retaining feature (44) having non continuous relief features (45) therein. The structure may be used for example with dispensable second layer, whereby an array of holes is created, for application as a physical, magnetic or biological sieve.

Figure 2I:
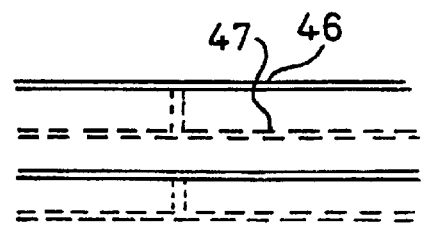

In FIG. 2I) is shown a scheme for a capillary channel structure for microfluidic or like application, in which capillaries (46) may be interconnected with capillaries (47) in adjacent planes.

Figure 3:
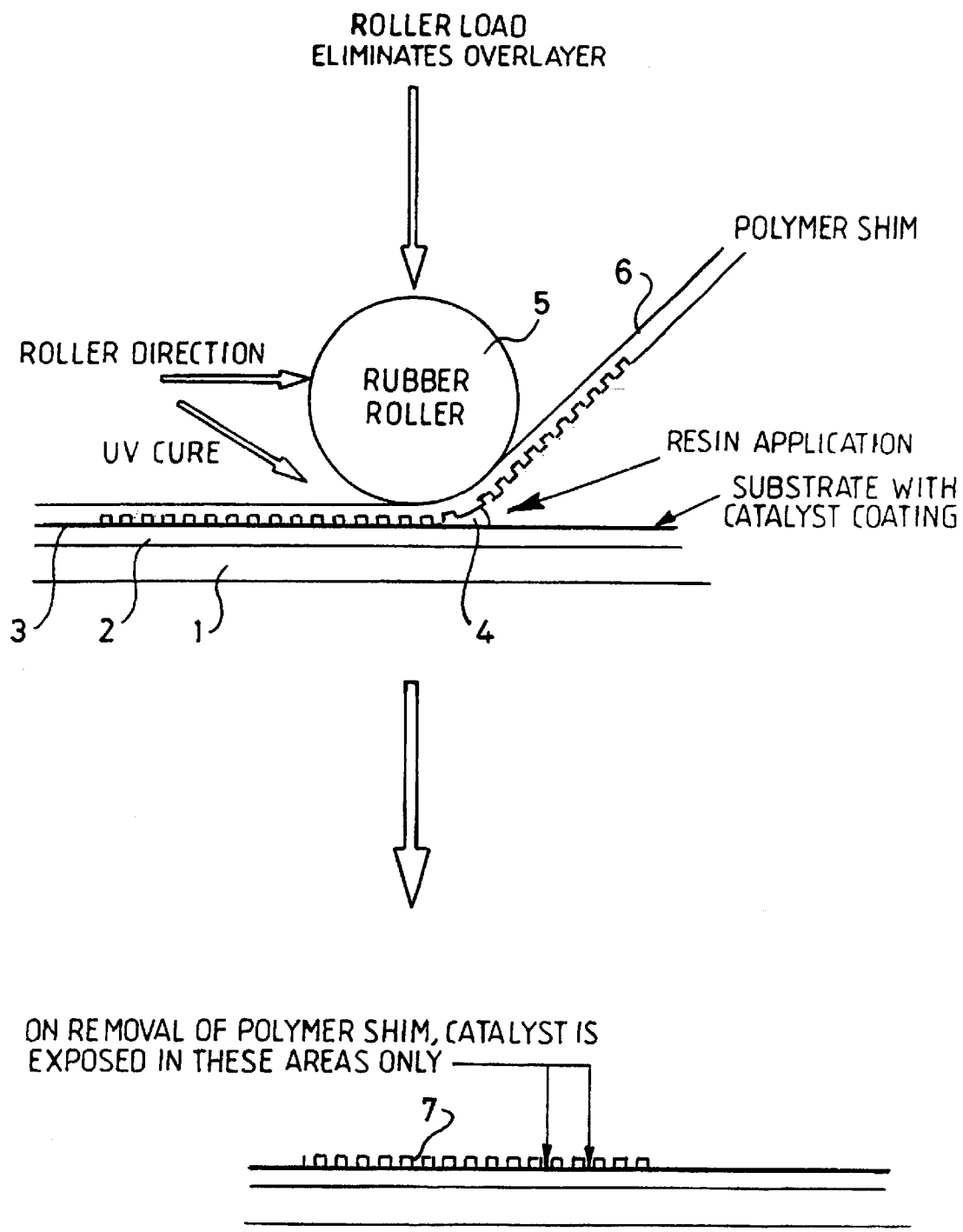
FIGS. 3–5 show in figurative manner, the apparatus and method for the manufacture of a microstructure of the invention.

In FIG. 3 is illustrated the first embodiment of the method as hereinbefore defined. The stage c) is shown, in the form of the method for provision of the second layer as hereinbefore defined, by means of an advancing line of contact. In the figure, a support layer (1) is illustrated, having thereon first substrate layer (2) and coating of target medium (3). A bead of resin (4) is advanced ahead of the line of contact formed by downwardly directed roller load from roller (5) and flexible dispensing layer (6) causing contact of flexible dispensing layer (6) with coated substrate (2). The flexible dispensing layer (6) is transparent to UV light, whereby curing of the resin takes place behind the advancing line of contact. On removal of the flexible dispensing layer (6), which may be readily peeled away, the first and second layers of the microstructure of the invention are provided, with marking in the base of channels (7) for the provision of the third layer in suitable manner.

Figure 4:
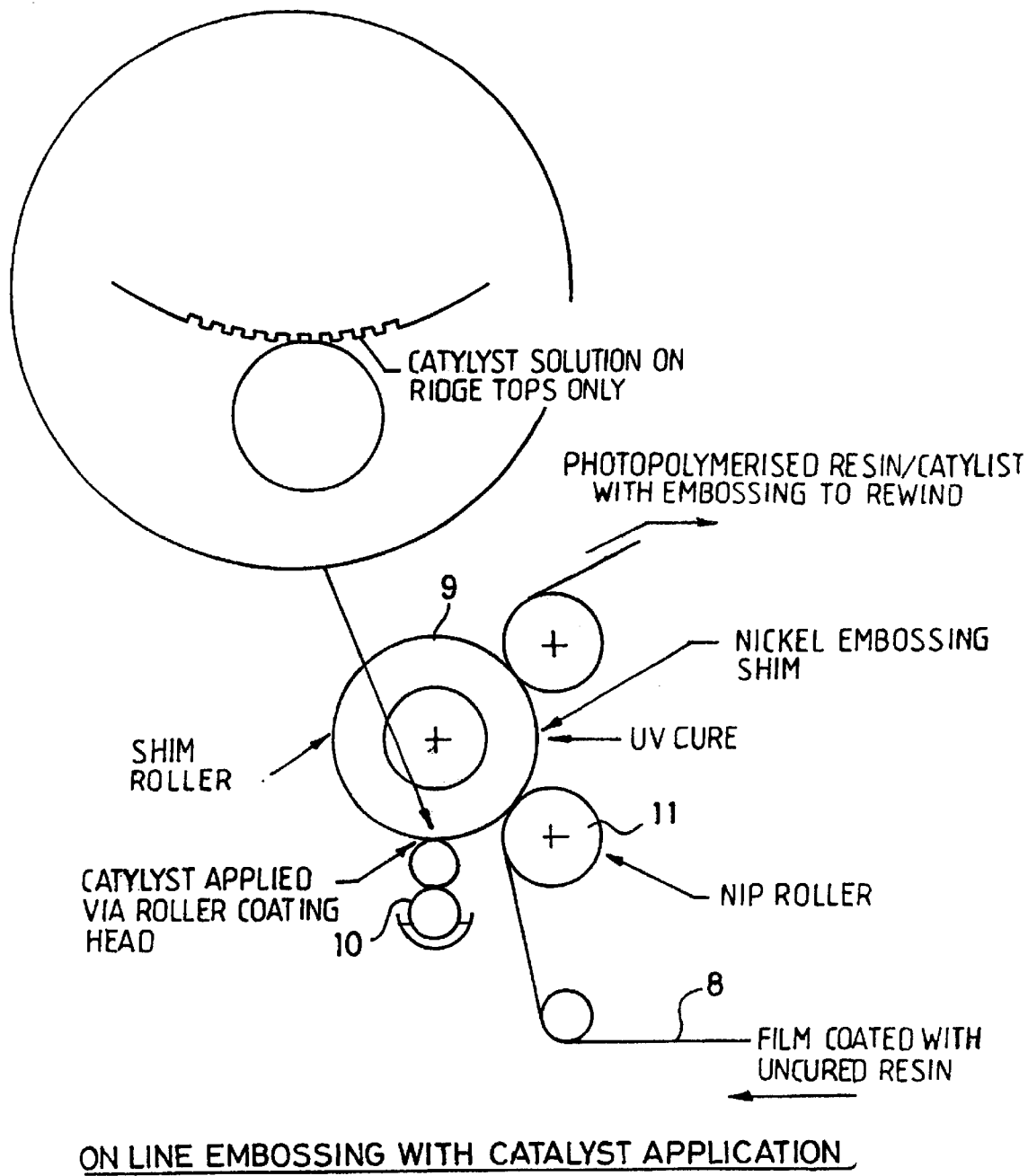

In FIG. 4 is shown the method of the second embodiment, which is conveniently operated with a flexible first layer and optional support layer on a reel to reel basis. In this case the first layer having a coating of relief forming polymer resin (8) is passed between two opposing rollers, a first roller (9) having an embossed "shim" surface which rotates to contact a means (10) for drawing target medium up to contact the high profile surface of the roller embossing. A second roller (11) contacts roller (9) in manner that the first coated layer (8) passes therebetween with suitable application of pressure to cause embossing of the uncured resin. In the process of embossing, the target medium is transferred by contact printing to the base of channels formed in the relief forming polymer The first layer is transparent to UV light, whereby curing is initiated prior to the detachment of the first layer (8) from roller (9). The apparatus comprises thereafter the rewinding of the product comprising first and second layers, and marking for a third layer as hereinbefore defined.

An alternative film path around the greater arc of roller (9) enables previously embossed film to be contacted with catalyst on roller (10) in manner to fill relief features, and is wiped between rollers (9) and (11), rotating at different speeds to remove catalyst from the surface of embossed features. This enables maximising catalyst coating in base and walls of channels with minimum undesired deposition. This method may be carried out with catalyst comprising a coating formulation of conductive particles in a binder.

The apparatus of FIG. 4 is used to selectively apply other materials such as processing materials, e.g. sacrificial layers, materials importing different chemical functionality, e.g. hydrophilicity/phobicity, differential wetting, and differential stick and release characteristics in any of the methods as hereinbefore described and illustrated.

Other film paths may be envisaged using the apparatus of FIG. 4 in manner to achieve any desired sequence or combination of embossing techniques or materials.

Figure 5:
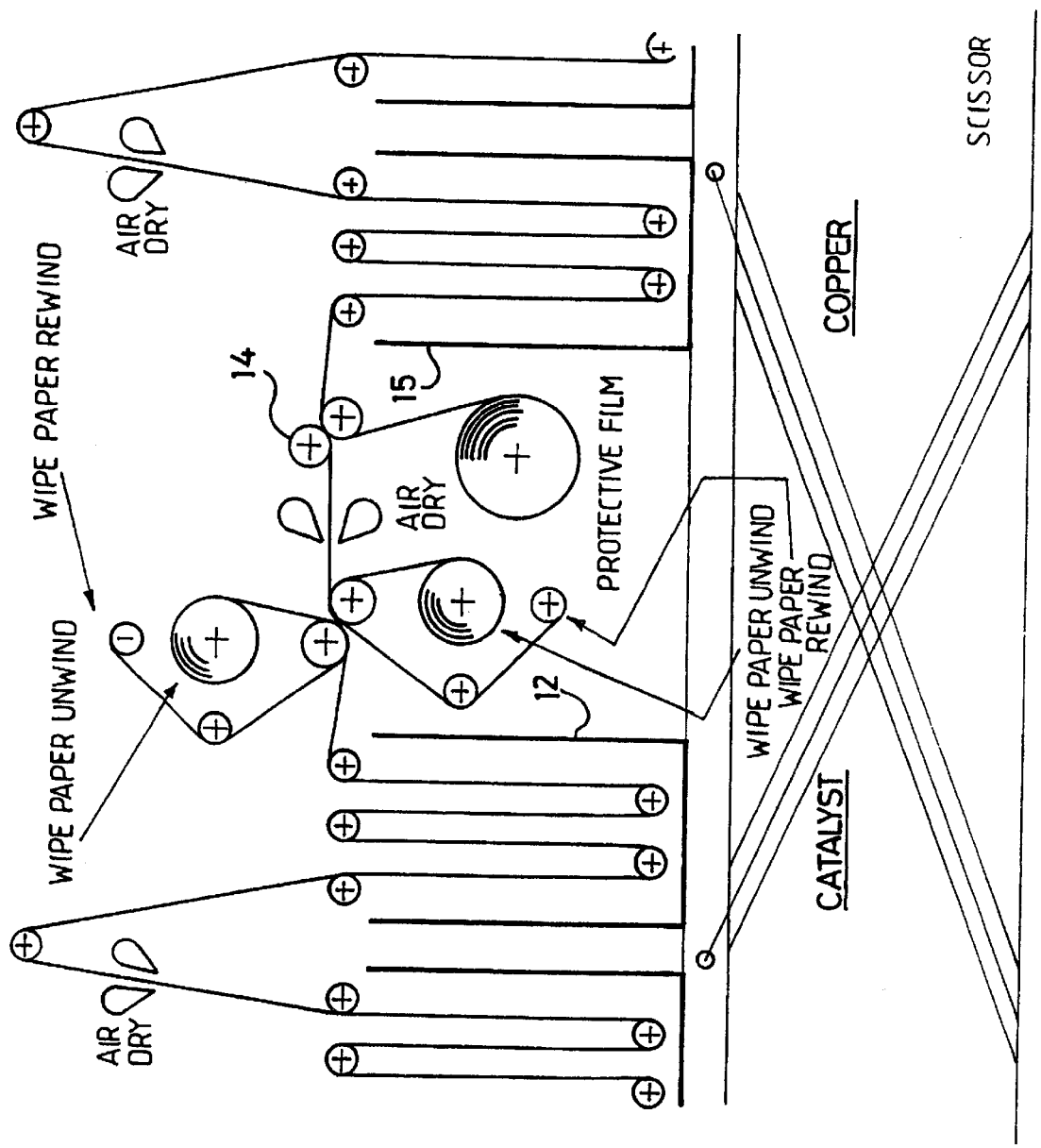

In FIG. 5 is illustrated an alternative scheme for the method of the second embodiment of the invention wherein the first layer having second layer comprising relief features as hereinbefore defined and at least one channel as hereinbefore defined is passed into a solution of catalyst in container (12) and thence to a double roller reeling out from two supply rollers each of two rolls of paper in manner to contact the embossed first layer at the highest relief profile regions thereof, essentially the protruding surface thereof, and to contact the reverse of the first layer in manner to remove target media selectively from these regions. The continuous first layer is thence transferred to a further double roller (14) for optional protection by means of sealing the interface of first and second layers, prior to immersion within a second receptacle (15) comprising a growth medium as hereinbefore defined and subsequently washed. The final product comprising a microstructure as hereinbefore defined with first, second and third layers may be wound onto a reel for subsequent use or cut into sections as desired.

The invention is illustrated in non-limiting manner with reference to the following examples.

EXAMPLE 1
Preparation of Target Precursor of Third Layer Material

3 Solutions were prepared for electroless deposition of copper from respective "Circuposit" and Electroless copper precursors, (ex-Shipley) as follows:

Solution P 'Circuposit (CP PD 'Pre-dip' 3340 solution)

CP PD 3340 was dissolved in de-ionised water, 84 mls initially, then made up to 100 ml solution once 27 g of CP PD 3340 had been solubilised in the water.

The solution is strongly acidic of pH approximately 1.
Solution Q 'Circuposit Catalyst (CP cat) 3344 solution/suspension 27 g of CP PD 3340 was dissolved in 24 mls de-ionised water, then 3.0 mls of CP CAT 3344 added in a polyethylene beaker. The solution is strongly acidic of pH approximately 1.

Solution R 'Electroless Copper (CPELCu), 3350 solution

De-ionised water 36.9 mls from a 10 ml graduated pipette, CPELCu 3350M 6.0 mls from a 5 ml pipette, CPELCu 3350A 2.1 mls from a 2.0 ml pipette, and CPELCu 3350B 5.0 mls from a 5 ml pipette were combined in a 100 ml wide necked polyethylene bottle with magnetic stirring.

EXAMPLE 2
Preparation of First Substrate Precursor of First Layer Material

The following substrate precursors were obtained in the form of extrudable powder or granule and prepared as first substrate A4 sheet having thickness as indicated.

2.1 100 polyester 'Melinex S505' (ICI PLC)

2.2 100 Polyethylene naphthenate 'Kaledex PEN' (ICI PLC)

2.3 100 Polyethersulphone 'Stabar PES'

2.4 100 Polyimide 'Upilex'

2.5 2 mm Sodaglass

EXAMPLE 3
Preparation of Relief Forming Polymer Precursor of Second Layer Material The following formulations A–H were used to prepare relief forming polymer precursor by combining the following components.

UV Crosslinkable Acrylate Resins
Formulation A
Photomer 6217, Aliphatic urethane acrylate (Akcros Chemicals Ltd.) 50 parts
Hexane diol diacrylate (UCB Chemicals) 50 parts
Photoinitiators
   Irgacure 651 (Ciba Additives) 2.5 parts
   Irgacure 184 ( " ) 2.5 parts
   Darcure 1173 ( " ) 2.5 parts
Thermal cure initiator
   Ethyl propyl oxy hexanoate 1 part
P115 Copolymerisable tertiary amine (UCB Ltd) 1 part
Formulation B (Modification of Formulation A)
Photomer 6217, (Akcros Chemicals Ltd.) 80 parts
Hexane diol diacrylate (UCB Chemicals) 20 parts
Photoinitiators
   Irgacure 651 (Ciba Additives) 1.5 parts
   Irgacure 184 ( " ) 1.5 parts
   Darcur 1173 ( " ) 1.5 parts
A174 adhesion Promoter (Union Carbide) 1 part
Methacrylic acid 1 part
Isobornyl acrylate 5 parts were included
Formulation C (Modification of Formulations A & B)
Photomer 6217 (Akcros Chemicals Ltd.) 80 parts
Hexane diol diacrylate (UCB Chemicals) 20 parts
Ebecryl 80, Oligomeric polyether tetraacrylate 16.25 parts
Irgacure 651 (Ciba Additives) 1.5 parts
Irgacure 184 ( " ) 1.5 parts
Darcure 1173 ( " ) 1.5 parts
Formulation D (Modification of Formulation C)
Components as listed for FORMULATION C 120.75 parts
Z-6020 Silicon surfactant (Dow Corning) 1 part
Formulation E
Photomer 6217, Aliphatic urethane acrylate (Akcros Chemicals Ltd.) 50 parts
Hexane diol diacrylate (UCB Chemicals) 50 parts
Photoinitiators
   Irgacure 651 (Ciba Additives) 2.5 parts
   Irgacure 1800 ( " ) 2.5 parts
Thermal cure initiator
   Tert Butylperoxy-2-ethyl-hexanoate, Interox TBPEH (Interox Ltd) 1 part
P115 Copolymerisable tertiary amine (UCB Ltd) 1 part
Formulation F
Photomer 6217 (Akcros Chemicals Ltd.) 80 parts
Hexane diol diacrylate (UCB Chemicals) 20 parts
Photoinitiators
   Irgacure 651 (Ciba Additives) 2.5 parts
LG156, Polymethylmethacrylate, 'Diakon' (ICI PLC) 17.5 parts
Formulation 65% Solids in Methyl Ethyl Ketone
Thermal and UV Curable Epoxy Resins
Formulation G
EPO-TEK 354 (Epoxy Technology Inc) 100 parts
(2 part Thermal Cure Formulation, Resin 90%, Hardener 10%)
DC 57 Surfactant (Dow Corning Ltd.) 250 ppm
FC430 Surfactant (3M) 250 ppm
Formulation H
OG 125 (Epoxy Technology Inc) 100 parts
(UV Curable epoxy Formulation, Refractive Index at 633 nm, 1.4600)
DC 57 Surfactant (Dow Corning Ltd.) 250 ppm
FC430 Surfactant (3M) 250 ppm

EXAMPLES 4 to 18
Preparation of Microstructures of the Invention

EXAMPLE 4

Circuit pattern was embossed using the procedure of PCT/GB94/02118, by curing the resin whilst in contact with surface relief features on a nickel shim through the back of the substrate to generate channels approximately 45 microns by 45 microns in cross section using Formulation A onto 100 micron polyester, 'Melinex S505'. The resin was first deposited down onto an A4 sheet of the substrate using roller coating with a 270 microns clearance set to give approximately 100 microns wet No. 6 Meyer bar. The resin supported on the substrate was brought into contact with the waveguide tracks patterned on a nickel shim. Whilst in contact with the shim, the resin was irradiated with UV light through the substrate. The resin photocrosslinks and a replica pattern was generated within the polymer matrix. The embossed substrate was then subject to a non-continuous (off-line) method according to FIG. 3 to obtain the product microstructure, whereby:

i) The complete embossing on the flexible substrate was immersed in Solution P for 5 minutes at room temperature, the solution being stirred with PTFE magnetic follower;

ii) then, without rinsing, immersed for 5 minutes at 35–40° C. in Solution Q, by use of a water bath. The solution was swirled occasionally during this period.

The embossed film was rinsed carefully in a 250 ml beaker of de-ionised water. The film, after first removing excess liquid with tissue, was blown dry or was allowed to air dry slowly.

iii) After drying, the surface of the circuit pattern was wiped with a tissue in a manner that the motion of the wiping was in the same direction as the channels. The objective was to remove catalyst from all areas except on the sides and base of the channels. Wiping was repeated 3 times.

iv) The film was then placed in a beaker of solution R for 2 minutes at 46+/−4° C. again with agitation. After a few minutes, copper was clearly visible within the channels of the pattern and the embossed film was removed from the solution. The film was washed in carefully de-ionised water a few times then dried.

The substrate film could be flexed without any apparent disruption to the copper tracks.

The copper had formed in the desired regions of the channels but nowhere else.

EXAMPLE 5

A microstructure was prepared using the process of Example 4 but in this case a high resolution circuit pattern was embossed to generate channels approximately cross section 7 microns by 7 microns with a separation in the range of down to 10 micron. In stage iii) the embossing was wiped with a cloth moistened with isopropyl alcohol to remove catalyst, care being taken not to wipe within the channels.

Microscopy confirmed that only the channels were filled with deposited copper and separation maintained and on this occasion the immersion period in Solution R was 25 minutes.

EXAMPLE 6

An microstructure was prepared using the process of Example 5 and the circuit pattern of Example 4. The deposition of copper was visible clearly after a few minutes and after 25 minutes the embossed structure was removed from solution. The copper in the channels was examined by Optical Microscopy.

EXAMPLE 7

Formulation B was used for embossing both circuit patterns of Example 4 and Example 5 onto S505 polyester using the process of Example 5. No appreciable difference was observed regarding the adhesion of copper within the tracks and the products behaved similarly to those produced in Examples 4 and 5.

EXAMPLE 8

Formulation C was used for embossing both circuit patterns of Example 4 and Example 5 onto D723 polyester using the process of Example 5. No appreciable difference was observed regarding the adhesion of copper within the tracks and the products behaved similarly to those produced in Examples 4 and 5.

EXAMPLE 9

Formulation D is deposited onto D723 Melinex polyester using the procedure of Example 5.

EXAMPLE 10

Formulation E is deposited onto 100 micron 'PEN' of Example 2 in the form of circuit pattern of Example 4. The channels were filled with copper as in Example 5.

EXAMPLE 11

The procedure of Example 4 is used with polymers 'Upilex' and 'Stabar' of Example 2 which are absorbing in the UV curing region applicable to the photoinitiators and thus restrict UV light of the appropriate wavelength to cure the resin. As a consequence the method of generating/curing the pattern onto the substrate is different. The nickel shim described containing the requisite pattern is used to generate a polymer replica of the opposite sex as described in Patent Application PCT/GB94/02118. This 'polymer shim' has built release properties and can be used in a lamination process to deposit a pattern onto the substrate. Again, this technique is described in Patent PCT/GB94/02 118.

EXAMPLE 12

Formulation F was deposited down in circuit pattern of Examples 1 and 2 generated as in Example 1. Copper tracks were deposited as in Example 1. The advantage of this combination of substrate and formulation is that there can be higher temperature usage of the product compared to those previously generated. For example, low temperature soldering of components onto the sheet can be carried out if necessary.

EXAMPLE 13

In some applications, the preferred substrate is glass. Formulation F was deposited onto the glass using a No. 3 Meyer bar, the resin thickness being of the order of 12–15 microns. A shim with circuit features was brought into contact with the resin and squeezed through a laminator to ensure intimate contact. The laminator rolls were set at 1 m/min. As the glass/resin/shim laminate emerged from the nip, the resin was illuminated through the base of the glass plate using a 'Blakray' UV lamp with a power output of 2.5 milliwatts/cm2 at a distance of 15 inches from the lamp. The UV light cures the resin and the shim could be removed from the surface of the crosslinked matrix to reveal the embossed channel.

The interface of this particular UV cured film on glass is susceptible to alkaline conditions, so this interface is protected during the 3 immersion stages to deposit copper tracks by applying adhesion tape to the edges thus preventing ingress of aqueous solution which would remove the film from the glass. As a consequence, the process described in Example 4 was repeated, tracks deposited and the tape removed at the end of the operation.

EXAMPLE 14

UV crosslinkable acrylates and methacrylate films as a general rule are not used for continuous operation at temperatures in the region in excess of 175° C. and they can be used only briefly at temperatures of 225–250° C. depending on the nature of the matrix. Heat curable epoxies have the advantage of higher temperature usage by the nature of their crosslinked matrix. However, if thermal stability is an issue for an application where copper tracks have to be deposited, then the substrate must also have improved thermal stability. In this example, a heat cure epoxy, EPO-TEK 354, was deposited and embossed and cured. This can be used for several hours at temperatures in excess of 300° C. and at higher temperatures for briefer periods.

The technique for embossing the circuit pattern was as follows.

FORMULATION G was coated onto 2 mm soda glass using a No. 2 Meyer bar to deposit approximately 12 microns of uncured epoxy. At this stage the viscosity of the resin is too low to give good replication and release but by leaving the film supported on glass for 3 hours at 60 C., then the epoxy had reached a suitable 'green state' for embossing, since the viscosity had risen. The embossing was carried out by passing the glass/resin and a nickel shim through a laminator at 1 meter/min.

In this case, the nickel shim was separated from the resin revealing the circuit pattern. The embossed epoxy on glass was left overnight, then baked for 2 hours at 150 C.

An alternative procedure would be to leave the shim in contact with the epoxy on glass during the high temperature crosslinking process.

The procedure described in Example 4 with copper being deposited within the tracks was followed.

Epoxies also have the additional advantage of good adhesion to glass and the interface between the glass and embossed film is not as susceptible to the alkaline conditions present when exposed to Solution C during the copper deposition stage.

EXAMPLE 15

FORMULATION H, a UV curable epoxy, was deposited onto glass as described in Example 14 and the method of lamination/curing/replication was used as described in Example 13. Improved adhesion of the resin compared to UV curable acrylates/methacrylates on glass is an advantage in certain applications since the interface is not susceptible to alkaline solutions.

The process described in Example 4 was followed to generate copper tracks.

EXAMPLE 16

A structure comprising surface relief features 7.5 micron wide by 7.5 micron deep with a minimum separation of 10 micron was prepared by the process of Example 4. A conventional nickel sulphamate electroforming solution was prepared (400 g/l of nickel sulphate and stainless steel anode and cathode plates inserted into the solution. The structure was mounted and secured in place on the cathode plate so as to cover all the exposed areas of the cathode plate but leaving the surface of the sample exposed. An electrical connection was made between the exposed surface relief features (on top of which had previously been deposited a thin layer of copper) and the cathode plate by applying a thin layer of silver conducting paint in such a way as to interconnect all the surface relief features together. The temperature of the plating bath was 50° C. and the pH of the solution was measured to be 4.2.

The anode and cathode plates were connected to a constant current power supply and plated at a current of 2 mA for 120 mins, at 4 mA for a further 60 mins and finally at 10 mA for a further 6 hours.

Examination using an optical microscope confirmed that the surface relief features had been over-filled with nickel, with width approximately twice that of the features prior to electroplating. The nickel had been selectively deposited only into the surface relief features treated with the precursor solution and coated with copper. Where the precursor material had been removed by wiping there was no evidence of nickel deposition.

EXAMPLE 17

A structure comprising surface relief features 45 micron wide by 45 micron deep was prepared by the method of Example 4. The structure was prepared for plating as in Example 16 and immersed into the same plating bath under the same conditions.

The structure was plated at 4 mA for 6 hours and 6 mA for a further 3 hours. On completion of plating the sample was removed from the cathode plate. The sample was inspected using an optical microscope as before. The surface relief features had been partially filled with nickel. The nickel had been selectively deposited only into the surface relief features treated with the precursor solution and coated with copper. Where the precursor material had been removed by wiping there was no evidence of nickel deposition. The sample was flexed in both directions to test the overall adhesion of the copper and nickel to the surface relief features. There was no lifting of the metal from the surface, indicating good adhesion of the metal layers.

EXAMPLE 18

Method for Direct Writing Generation of Surface Relief Features

The experimental apparatus consisted of a table onto which was mounted a flat steel bed of length 450 mm and width 80 mm and a head assembly guided on bearings mounted down the edge of the bed and driven by a motorised screw thread at controlled speed up and down the length of the bed. A blue light was made to traverse the bed by mounting onto the head assembly and directed towards the bed (ICI LUXOR lightbox model 4000 delivering a power output of 220 W in the wavelength range 400 to 450 nm). The head assembly was further mounted with a holder for a polymer resin dispenser and air pressure pump to apply resin to the dispenser nozzle. An angle and micron adjuster allowed dispensing direction control and adjustment in micron steps in direction transverse to the head assembly, with resin dispensed just in front of the light.

The following polymer resin formulations were prepared:

Formulation A (viscosity 5000 mPa.s): ICI Luxtrax resin grade 000V

Formulation B: AKROS Chemicals, polyester acrylate Actilane 505 (100 parts) comprising Camphorquinone (1.5 parts)

Dimethylamino ethyl methacrylate (2 parts)
Irgacure 1800 (2 parts)

Formulation C (viscosity 90 Mpa.s):
UCB Chemicals, polyester acrylate Ebecryl (100 parts)
Camphorquinone (1.5 parts)
Dimethylamino ethyl methacrylate (2 parts)
Irgacure 1800 (1.5 parts)

(a) Table speed was 0.47 m/min, nozzle diameter 1.1 mm, air pressure 25 psi. was used. Parallel tracks of resin Formulation A were deposited onto a 375 micron thick polycarbonate substrate (LEXAN sheet) and cured for a further 35 s after deposition using a second pass with the head assembly. Self-supporting track features were successfully written.

(b) The experiment of (a) was repeated except using a resin with a lower viscosity formulation B). Tracks were successfully written.

(c) The experiment of (b) was repeated using a pressure of 41 psi and speed of 0.60 m/min. Tracks were successfully written.

(d) Nozzle of inner diameter 110 micron was used with pressure 42 psi and speed 0.65 m/min in the method of a). Tracks were successfully written.

(e) Tracks were written using the conditions of (d) above and a lower viscosity Formulation C. The tracks did not hold their form correctly due to the viscosity of the resin being too low.

(f) The experiment of (e) above was repeated except with a higher head speed of 1.16 m/min. Tracks were successfully written with height measured to be 12.4 micron using an Alpha Step 200 surface profiling machine, width 110 micron and spacing 60 micron apart.

(g) With nozzle comprising capillary of inner diameter 50 micron, 375 micron thick polycarbonate substrate was coated with 10 nm of chromium and 60 nm of silver. The pressure was 30 psi and the table speed 1.16 m/min. Tracks were successfully produced with width 110 micron and separation 60 micron.

(h) Using low viscosity resin Formulation C. Tracks were written using the 50 micron capillary, un-metallised polycarbonate substrate, air pressure of 3 psi and head speed to 0.88 m/min. Tracks were successfully written with width 12 micron, height 1.9 micron and separation 220 micron.

(i) Tracks were written with resin formulation C as for (h). The polycarbonate substrate was coated with metal as in (g). The air pressure was 6 psi and the head speed 1.16 m/min. Tracks were successfully written with width of the tracks measured to be 51 micron and separation 109 micron.

What is claimed is:

1. Method for the production of a continuous composite comprising a multifunctional microstructure of at least one fuctionalising material selected from substantially non UV curable material obtained by growth on a marker material; and a relief forming material which comprises a material which is at least partially UV or thermally curable, thermally formable or chemically reactive; the composite is a product of a process comprising:
   micromoulding with use of an advancing line of contact along a rigid or flexible supporting layer to provide a layer of the relief forming material having a plurality of relief features and defining at least one retaining feature; and
   simultaneously or subsequently depositing the functionalising material in the at least one retaining feature, wherein functionalising material is deposited by accessing a marker material in the retaining feature with subsequent growth thereon.

2. Method according to claim 1 which further comprises removing the supporting layer and the layer of relief forming material.

3. Method according to claim 1 which comprises the stages
   a) providing a first flexible supporting layer; having a receptive surface;
   b) contacting the surface or part thereof with a precursor of targeted growth functionalising material comprising target medium;
   c) providing a second layer of a relief forming material over the receptive surface;
   d) providing a plurality of relief features formed in the second layer of relief forming material to provide at least one retaining feature with a substantially zero overlay of relief forming material in the base of the retaining feature; and
   e) contacting with a growth medium in manner to provide a third layer of at least one substantially non UV curable, functionalising material contained within the at least one retaining feature;
wherein the substantially zero overlay allows contact of target and growth medium.

4. Method according to claim 1 comprising:
   a) providing a first flexible supporting layer; having a receptive surface;
   b) contacting a base of the at least one retaining feature with a functionalising material or precursor thereof by means of selective or non selective deposition;
   c) providing a second layer of a relief forming material over the receptive surface;
   d) providing a plurality of relief features formed in the second layer of relief forming material to provide at least one retaining feature with a substantially zero overlay of relief forming material in the base of the retaining feature; and
   e) contacting with a growth medium in manner to provide a third layer of at least one substantially non UV curable, functionalising material contained within the at least one retaining feature.

5. Method as claimed in claim 3 wherein the functionalising material is provided as a third layer by the following steps:
   B1) mould feature formed in a flexible dispensing layer;
   B2) applying sufficient of a functionalising material or its precursor to substantially or partially fill or line the at least one mould feature, along the line of contact;
   B3) progressively contacting the receptive surface with the flexible dispensing layer such that the line of contact moves across the receptive surface and sufficient of the functionalising material or its precursor is captured by the mould feature so as to substantially or partially fill or line the mould feature; and optionally, thereafter
   B4) releasing the flexible dispensing layer from the at least one relief feature.

6. A method according to claim 1, wherein said depositing the functionalising material comprises depositing in an in-line manner.

7. A method according to claim 1, wherein said depositing the functionalising material comprises depositing as a layer about the relief features prior to, during or subsequent to the formation of the relief features, wherein the relief features are created by replication of the material or its precursor.

8. A method according to claim 1, wherein said depositing the functionalising material comprises depositing within the at least one retaining feature with thickness, deposit width or spacing between adjacent deposits of the order of micro level to molecular level.

9. A method according to claim 1, wherein said relief forming material comprises additionally at least one functionalising material which is the same as or different to that deposited within the at least one retaining feature.

10. A method according to claim 9, wherein said functionalising material comprises material adapted for energy differentiation, energy manipulation, energy conversion between different forms, transformation of energy density, spatial transformation and transformation along a time scale.

11. A method according to claim 9 where said functionalising material comprises material adapted for separating materials of different phases, separating or shielding light of selected wavelengths, transporting materials by capillary action, transformation of voltage, wave length conversion of light, transportation of energy, power transmission and communication, energy (battery) storage and (magnetic) data storage.

12. A method according to claim 1 wherein said functionalising material comprises miniaturized fine lines substantially free from distortion effects by virtue of highly precise production techniques.

13. A method according to claim 1 wherein said functionalising material comprises miniaturized fine lines providing track density comparable with high pin out densities of currently miniaturized microchips to enable direct chip on board mounting.

14. A method according to claim 1 wherein said functionalising material comprises miniaturized fine lines providing automatic identification such as bar codes which may be interrogated optically, magnetically, by microwave or a combination thereof.

15. A method according to claim 1 wherein said functionalising material comprises miniaturized fine lines having low density fine line coverage adapted for high optical transmission for displays, combined with features of security, reducing unauthorized, indirect line viewing, and combinations thereof.

16. A method according to claim 1 wherein said functionalising material comprises miniaturized fine lines associated with the relief shape and, an aspect ratio derived from at least one retaining feature of the microstructure.

17. A method according to claim 1 wherein said functionalising material comprises three dimensional micro circuitry devices, by use of connection in planes of layers and between additional planes of such layers, or by use of highly flexible circuitry which may be folded into a three dimensional shape for miniaturization of products, said associated with other multifunctional modules with improved robustness of circuit tracks to failures, with provision of progressive failure safeguards.

18. A method according to claim 1 wherein said functionalising material comprises fine line circuitry together with associated packaging wherein additional functionality is provided by the packaging, said packaging comprises a microstructure or array thereof for efficiency of production.

19. A method according to claim 1 wherein said functionalising material is selected from the group consisting of metals from Groups Va, VIa, VIIa, VIII, Ib, IIb, IIIb, IVb, Vb, VIb, and the actinides of the Periodic Table of the Elements and from known UV curable magneto, ferro or electrically active polymer.

20. A method according to claim 1 wherein said functionalising material is selected from the group consisting of V, Cr, Mo, W, Mn, Re, Fe, Co, Rh, Ni, Pd, Pt, Cu, Ag, Au, Zn, Cd, Al, C, Si, Sn, Pb, Sb, P, Te, Th, and alloys thereof; and from processable forms of polyaniline, polyvinylene, polyuthiophene, polypyrrole, polyphenylene, polyphenylenevinylene and precursors, analogues or copolymers thereof.

* * * * *